(12) United States Patent
Scrutchfield et al.

(10) Patent No.: US 10,969,414 B2
(45) Date of Patent: Apr. 6, 2021

(54) MONITORING ELECTRIC SYSTEMS FOR WIRING FAULTS

(71) Applicant: SunPower Corporation, San Jose, CA (US)

(72) Inventors: Donald H. Scrutchfield, Austin, TX (US); Miles F. Bintz, Cedar Park, TX (US); Dylan W. Benjamin, San Francisco, CA (US); Kevin C. Fischer, Orinda, CA (US)

(73) Assignee: SUNPOWER CORPORATION, San Jose, CA (US)

( * ) Notice: Subject to any disclaimer, the term of this patent is extended or adjusted under 35 U.S.C. 154(b) by 407 days.

(21) Appl. No.: 15/945,375

(22) Filed: Apr. 4, 2018

(65) Prior Publication Data

US 2019/0310292 A1 Oct. 10, 2019

(51) Int. Cl.
*G01R 35/04* (2006.01)
*G01R 22/06* (2006.01)
*H02J 13/00* (2006.01)

(52) U.S. Cl.
CPC .......... *G01R 22/068* (2013.01); *G01R 35/04* (2013.01); *H02J 13/00001* (2020.01)

(58) Field of Classification Search
CPC ... G01R 22/068; G01R 35/04; H02J 2300/20; H02J 2300/24; H02J 2310/14; H02J 3/46; H02J 3/381; H02J 3/003; H02J 13/00004; H02J 13/0028; Y02B 70/3225; Y02B 70/30; Y04S 20/221–222; Y04S 20/242; Y02E 10/56

See application file for complete search history.

(56) References Cited

U.S. PATENT DOCUMENTS

| | | |
|---|---|---|
| 9,547,033 B1 | 1/2017 | Batten et al. |
| 2009/0302831 A1 | 12/2009 | Adams et al. |
| 2015/0340868 A1 | 11/2015 | Chapman |
| 2016/0131688 A1* | 5/2016 | Carlson ................. G01R 22/10 702/61 |
| 2017/0030950 A1 | 2/2017 | Uebel et al. |
| 2017/0033734 A1 | 2/2017 | Uebel et al. |
| 2017/0104447 A1 | 4/2017 | Bintz et al. |
| 2017/0115119 A1 | 4/2017 | Chapman et al. |
| 2017/0288599 A1 | 10/2017 | Chapman et al. |
| 2018/0006463 A1 | 1/2018 | Bintz, II et al. |

\* cited by examiner

*Primary Examiner* — Toan M Le
(74) *Attorney, Agent, or Firm* — Jenkins, Wilson, Taylor & Hunt, P.A

(57) ABSTRACT

Methods, systems, and computer readable media are disclosed for monitoring electric systems for wiring faults. In some examples, a system includes a production power meter coupled to a power generation system of a building and configured for measuring electric power generated by the power generation system, one or more consumption power meters coupled to an electric system of the building and configured for measuring electric power consumed by the electric system, and a computer system coupled to the production power meter and the consumption power meters. The computer system is programmed for determining that at least one power meter is installed with a reversed polarity that is reversed with respect to an installation specification, resulting in the computer system receiving measured values from the at least one power meter having an incorrect sign.

18 Claims, 7 Drawing Sheets

MONITORING ELECTRIC SYSTEMS FOR WIRING FAULTS

BACKGROUND

The subject matter described in this specification relates generally to monitoring electric systems that produce and consume electric power, e.g., residential and commercial electric systems that consume power from a utility grid and produce power using an intermittent power source such as a photovoltaic solar system.

Photovoltaic solar electrical generation systems produce electrical energy that can supplement electrical power that is provided from a utility company. Monitoring of power within this photovoltaic solar system is typically performed with metering data that is obtained from measurement of electrical energy at the installation site. Metering functions that produce photovoltaic generation performance, as well as power consumed by the customer, depend on measurement of current and voltage. Electrical connections during installation of the photovoltaic solar system include routing and connection of current transformers (CTs) or similar current monitoring transducer devices. Installation errors can include incorrect routing, termination, or physical orientation of CTs, producing incorrect or absence of power monitoring functionality.

SUMMARY

A power metering system can be configured for detecting wiring faults in monitoring circuits for electric systems. In response to detecting a wiring fault, the system can provide alerts regarding the wiring faults, automatically compensate for the wiring faults, or both.

In some examples, a system includes a production power meter coupled to a power generation system of a building and configured for measuring electric power generated by the power generation system, one or more consumption power meters coupled to an electric system of the building and configured for measuring electric power consumed by the electric system, and a computer system coupled to the production power meter and the consumption power meters. The computer system is programmed for receiving a production time series of electric production values from the production power meter; receiving a consumption time series of electric consumption values from the consumption power meters; and determining, by comparing the production time series and the consumption time series to respective reference values, that at least one power meter is installed with a reversed polarity that is reversed with respect to an installation specification, resulting in the computer system receiving measured values from the at least one power meter having an incorrect sign.

In some examples, a system includes a number of consumption power meters coupled to a multi-phase electric system of a building, each consumption power meter being configured for measuring electric power consumed by a respective phase line of the multi-phase electric system and a computer system coupled to the consumption power meters. The computer system is programmed for receiving, from each consumption power meter, a consumption time series of electric consumption values; comparing at least a first consumption value from a first consumption power meter to a second consumption value from a second consumption power meter; and determining, by comparing the first consumption value with the second consumption value, that a fault exists in the wiring of the multi-phase electric system.

In some examples, a system includes a current measurement input port; an input circuit coupled to the current measurement input port; an analog-to-digital converter (ADC) coupled to the input circuit; and a computer system coupled to the ADC. The input circuit includes a voltage supply circuit supplying a reference direct current (DC) voltage and high and low termination resistors configured as loading for signal matching a current measurement circuit at the current measurement input port. The ADC has an operating range centered over the reference DC voltage. The computer system is programmed for: receiving a measurement value from the ADC; determining that the measurement value indicates an offset voltage resulting from the DC reference voltage being divided over the high and low termination resistors; and as a result of determining that the measurement value indicates the offset voltage, determining that the current measurement circuit is not connected to the current measurement input port.

The subject matter described in this specification may be implemented in hardware, software, firmware, or combinations of hardware, software and/or firmware. In some examples, the subject matter described in this specification may be implemented using a non-transitory computer readable medium storing computer executable instructions that when executed by one or more processors of a computer cause the computer to perform operations. Computer readable media suitable for implementing the subject matter described in this specification include non-transitory computer-readable media, such as disk memory devices, chip memory devices, programmable logic devices, random access memory (RAM), read only memory (ROM), optical read/write memory, cache memory, magnetic read/write memory, flash memory, and application specific integrated circuits. In addition, a computer readable medium that implements the subject matter described in this specification may be located on a single device or computing platform or may be distributed across multiple devices or computing platforms.

DETAILED DESCRIPTION

Figure 1:
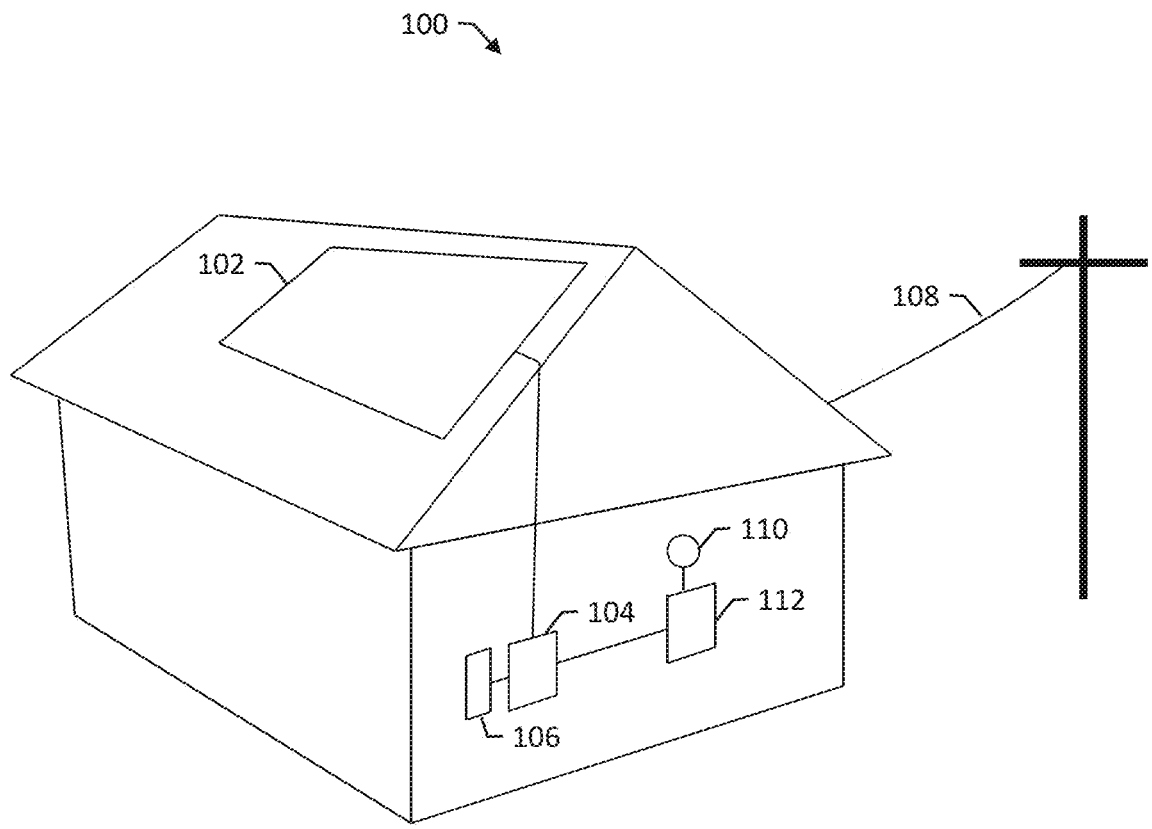
FIG. 1 is a diagram of an example electric system.

FIG. 1 is a diagram of an example electric system 100. The electric system 100 includes a solar panel system 102 including one or more photovoltaic solar panels, one or more inverters 104 coupled to the solar panel system 102, and a photovoltaic supervisor system 106. The electric system 100 also includes a connection 108 to a utility grid, an electric meter 110 for the connection 108 to the utility grid, and an electric panel 112 for the electric system 100.

When the sun is shining on the solar panel system 102, the solar panel system 102 produces direct current (DC) electric power and provides the DC power to the inverters 104. In response, the inverters 104 produce alternating current (AC) power for consumption by loads on the electric system 100 or for providing to the connection 108 to the utility grid.

When the loads on the electric system 100 consume more power than is provided by the solar panel system 102, the loads draw power from the connection 108 to the utility grid. When loads consume less power than is provided by the solar panel system 102, the solar panel system 102 can provide the excess power to the connection 108 to the utility grid. Although FIG. 1 illustrates a grid-tied electric system 100, the systems and methods described in this specification can be applied in various other types of electric systems.

The photovoltaic supervisor system 106 is a computing system configured, by virtue of appropriate programming, to monitor the solar panel system 102 and perform one or more actions based on monitoring the solar panel system 102. For example, the photovoltaic supervisor system 106 can be configured for interfacing with net and sub meters, inverters, and other optional components of the system.

In some examples, the photovoltaic supervisor system 106 measures power output by the solar panel system 102 and transmits measurements to a remote system, e.g., a homeowner's computer system, a building manager's computer system, or a solar panel manufacturer or installer computer system. In some examples, the photovoltaic supervisor system 106 does not directly monitor the solar panel system 102; instead, the photovoltaic supervisor system 106 can monitor or meter the inverters coupled to the solar panel system 102. The photovoltaic supervisor system 106 can be enclosed in a weatherproof housing for outdoor installation.

Power metering provides performance data to the customer, and possibly also to the utility, describing how much electrical energy is being generated by the photovoltaic system, as well as how much power the customer is consuming. Differences between consumption and photovoltaic generation provide useful, and sometimes financially-tied information of net energy usage.

Proper metering functionality depends on correct operation of the associated measurement equipment, including CTs or similar devices used to measure electrical current. Correct operation of the CTs depends on the CTs being properly installed on their designated wiring conductors, properly terminated on the monitoring equipment, as well as being in their correct orientation to determine direction of energy flow. Incorrect installation or wiring can produce invalid, or loss of power data. Additionally, poor connections or incorrectly terminated ac power conductors risk at a minimum incorrect system operation, and depending on the termination deficiency, could result in a potentially hazardous electrical condition.

The photovoltaic supervisor system 106 can be configured monitoring electric systems to alleviate one or more of these issues. The electric systems can be single, as well as multi-phase electric systems. For example, the photovoltaic supervisor system 106 can be configured, by virtue of appropriate programming, for determining that at least one power meter is installed with a reversed polarity that is reversed with respect to an installation specification, or for determining that a fault exists in the wiring of a multi-phase electric system, or both. The photovoltaic supervisor system 106 can be configured for providing alerts regarding wiring faults, or for automatically corrected measurement errors resulting from wiring faults, or both.

Site wiring errors of CTs introduce incorrect power measurement, and types of errors can include, e.g., CTs installed on the wrong ac conductor, or CTs installed backwards so they report current flowing opposite than their intended monitoring expects. Site wiring faults can include, e.g., improper termination of ac line voltage conductors, or poor or missing ground or neutral wiring connections. Determination of proper integrity or functionality provides indication of the overall PV system installation status and health. That indication can be provided directly to an installer or technician on-site, or can be reported through PV monitoring facilities to remote logging or recording locations for further examination or remote diagnostics.

Many CT wiring errors may be corrected by system manipulation of their connected signals. As an example of automatic correction, if it is determined one or both CTs are installed backwards, metering solutions can be instructed automatically to reverse the interpreted polarity of their measured data. This completely accomplishes the same result of otherwise physically reversing their wires, and eliminates the need of a service call to the site.

Monitoring and automatic correction may be extended to distributed generation, such as sites with individual micro-inverters, typical of many solar PV electrical generation installations. For example, measurement of power reported from each micro-inverter can be compared to the aggregate measured power from a system level metering implementation, where the site monitoring then can make appropriate decisions for enabling, disabling, or reducing generation from any or all of the micro-inverters. Decisions are made as appropriate by site-level, and known utility requirements.

The methods and systems for monitoring and automatic correction described in this specification can be integrated within the system 106 for photovoltaic solar monitoring, e.g., occurring automatically, and executing as part of normal photovoltaic system operation, not requiring intervention nor external test initiation. Results can be presented in real-time or near real-time, monitoring and reporting continuously during normal photovoltaic solar system operation. Qualifying events that potentially warrant further automatic correction, may optionally be selected to occur or not, based on site or system dependencies if needed.

Figure 2:
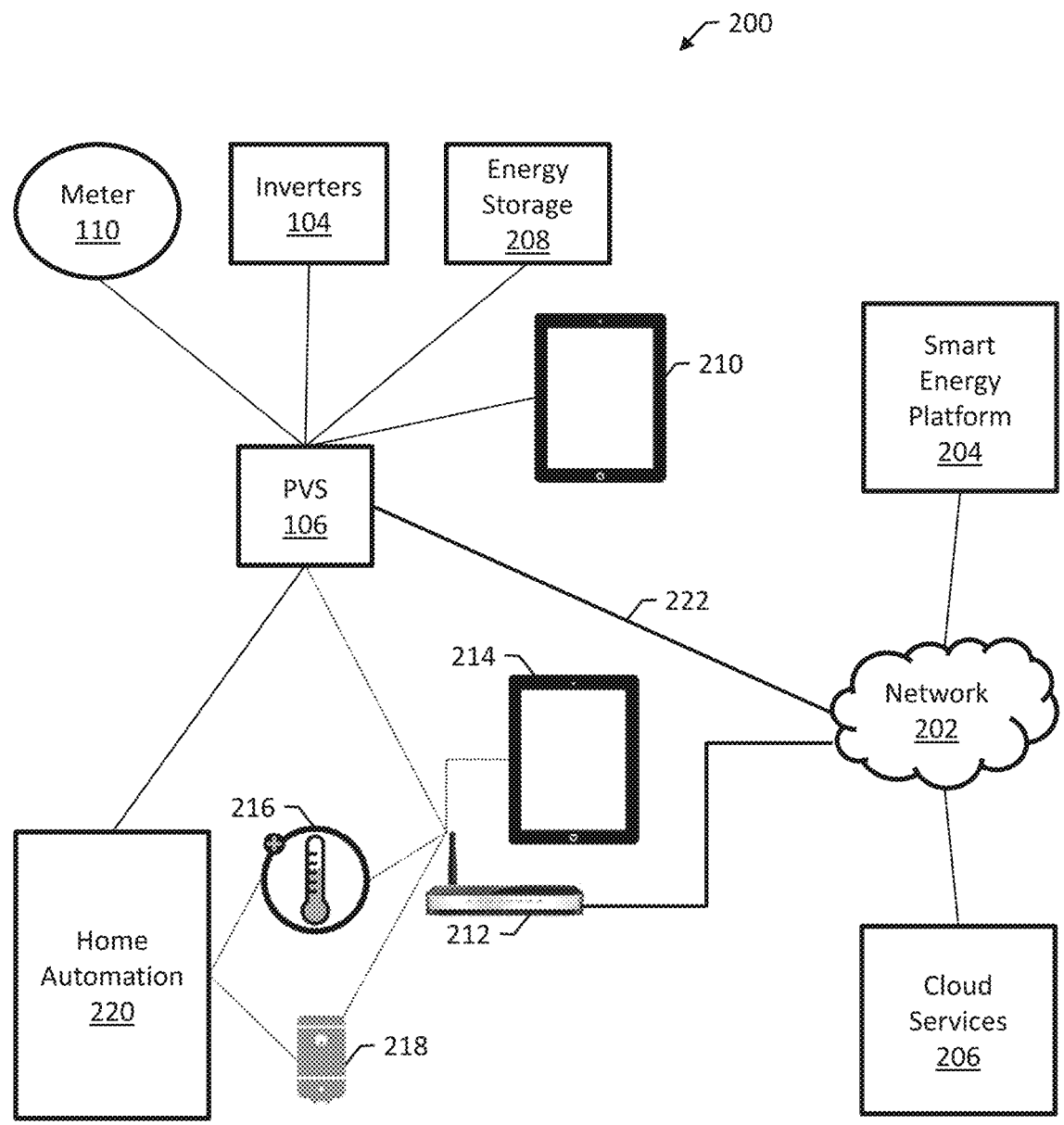
FIG. 2 is a block diagram of an example environment for a photovoltaic supervisor system.

FIG. 2 is a block diagram of an example environment 200 for the photovoltaic supervisor system 106. The photovoltaic supervisor system 106 communicates over a data communications network 202, e.g., the Internet, with a remote system 204 executing on a system of one or more computers and/or one or more computer servers 206 providing cloud computing services related to energy monitoring and management.

The photovoltaic supervisor system 106 communicates, either directly or over a data communications network, with one or more optional components of the system, including a consumption meter 110, which can be a smart meter; one or more inverters 104, which can include microinverters and/or string inverters that are each configured to couple to a string of solar cells; an energy storage device 208, e.g., one or more batteries and a control system of one or more computers; a commissioning device 210, e.g., a tablet computer or other appropriate computing device used to verify properties of a solar system after installation; and a wireless access point 212 for accessing, e.g., a local area network (LAN).

The photovoltaic supervisor system 106 can communicate, using the wireless access point 212, with a customer device 214 such as a tablet computer; the remote system 204 and the cloud services servers 206 using the network 202; a smart thermostat 216; one or more controllable electric loads 218; and a home automation system 220. The home automation system 220 can include one or more computers providing one or more services such a personal safety applications and appliance control applications.

In operation, the photovoltaic supervisor system 106 can take energy measurements and transmit the energy measurements to the remote system 204. The photovoltaic supervisor system 106 can transmit the energy measurements to other systems, e.g., the cloud services server 206, which can be configured to provide computing services for, e.g., home automation. In some examples, the remote system 204 and/or the cloud services server 206 can be configured for remote configuration modification and troubleshooting of the photovoltaic supervisor system 106, e.g., using a cloud-hosted web application.

Figure 3:
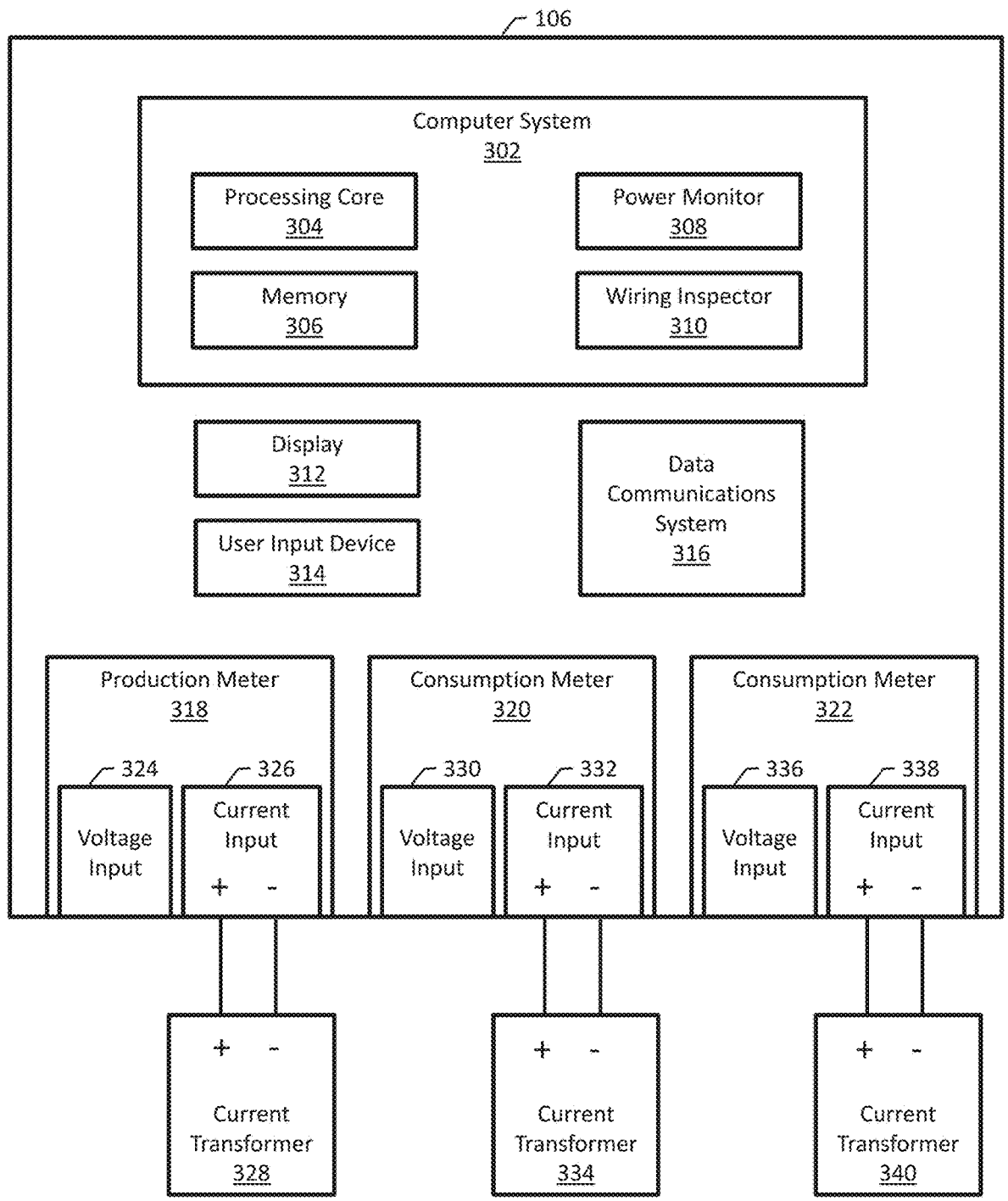
FIG. 3 is a block diagram of an example photovoltaic supervisor system.

FIG. 3 is a block diagram of an example photovoltaic supervisor system 106. The system 106 can be implemented using any appropriate combination of one or more circuit structures, e.g., printed circuit boards (PCBs) and other types of cards. The system 106 can be enclosed in a weatherproof housing. Although the system 106 is described with respect to a photovoltaic solar system, in general, the system 106 can be used in conjunction with any appropriate electric system combining a power generator, such as an intermittent power source, and electric loads.

The system 106 includes a computer system 302, including a processing core 304 and memory 306. The processing core 304 can be one or more processors configured to execute, e.g., a LINUX kernel, or any appropriate software for intelligent processing and embedded processing. The memory 306 can include, e.g., flash storage and dynamic random access memory. In operation, the processing core 304 executes software to cause the system 106 to perform various functions, e.g., taking measurements, transmitting measurements, switching communication channels in response to detecting lack of availability of communication channels, and executing control algorithms for other components.

The system 106 includes a data communication system 316 that can include wireless communication radios or wired communication circuits or both. For example, the data communication system 316 can include one or more of: a WiFi radio; a cellular radio; a mesh network radio; a wide area network (WAN) Ethernet port; an RS-485 port; a local area network (LAN) Ethernet port; and a power line communication (PLC) port. The system 106 can be configured to connect to inverter control systems (e.g., for microinverters) using, e.g., a PLC interface of the data communications system 316. The system 106 can push firmware upgrades to devices, e.g., inverters.

The system 106 includes at least one power meter 318 designated for measuring power produced by a photovoltaic solar system or other appropriate intermittent power source, e.g., one or more wind turbines or energy storage devices such as batteries. The system 106 also includes power meters 320 and 322 designated for measuring power consumed by an electric system. In some examples, the power meters 318, 320, and 322 are implemented on a metering subcard or metering circuit subsection for taking energy measurements. The metering subcard can include a microcontroller for, e.g., controlling the operation of the metering subcard and the measurement functions of measuring and sending measurements to the processing core 304 for display or transmission or both.

Typically, the power meters 318, 320, and 322 perform metering using voltage measurement circuits 324, 330, and 336 and current measurement circuits 326, 332, 338. A voltage measurement circuit includes, e.g., one or more scaling networks configured, by virtue of one or more resistors and one or more buffering amplifiers, to translate a line voltage from a measurement input to a signal at a lower voltage than the line voltage. A current measurement circuit includes, e.g., one or more current transformers 328, 334, and 340 configured to provide low level voltages to measurement electronics that result from current that flows through one or more power carrying conductors.

The power meters 318, 320, and 322 are designated to measure power produced on one meter 318 and power consumed on two meters 320 and 322; however, the system 160 can be configured for other measurement combinations. For example, the system 160 can include a three-channel input for three phase metering; the three channels can alternatively be split so that one channel is used for consumption metering and two channels are used for production metering. Additional channels may be added and selectively included for various combinations of consumption and production measurement.

The computer system 302 includes a power monitor 308 implemented using the processing core 304 and memory 306. The power monitor 308 is configured for receiving, over time, measured values from the power meters 318, 320, and 322. The power monitor 308 can present portions of data from the measured values, e.g., by displaying time series of measured values on the display 312 or transmitting time series of measured values to remote systems using the data communications system 316. The portions of the data can be, e.g., user-selected by a user using the user input device 314, or pre-programmed, or remotely controlled by receiving instructions from a remote system using the data communications system 316.

For example, suppose that the production meter 318 provides a time series of measured production values from a photovoltaic solar system and that the consumption meters 320 and 322 provide time series of measured consumption values from an electric system. The electric system is configured, by virtue of appropriate wiring, to consume electric power from the photovoltaic solar system and a utility grid and to export electric power to the utility grid when the power generated by the photovoltaic solar system exceeds the power consumed by the electric system. The power monitor 308 can determine a net energy export time series for the electric system based on the production time series and the consumption time series and then present selected portions of the net energy export time series.

The computer system 302 includes a wiring inspector 310 implemented using the processing core 304 and memory 306. The wiring inspector 310 can be configured for determining that at least one power meter is installed with a reversed polarity that is reversed with respect to an installation specification, or for determining that a fault exists in the wiring of a multi-phase electric system, or both.

For example, suppose that the wiring inspector 310 is configured for determining that at least one power meter is installed with a reversed polarity that is reversed with respect to an installation specification. The installation specification specifies positive and negative input terminals in the current measurement inputs 326, 332, and 338 and specifies positive and negative connections from the CTs 328, 334, and 340.

If one of the CTs 328, 334, and 340 is installed with a reversed polarity, the power monitor 308 will receive measured values from the power meter for that CT having an incorrect sign. For example, if the current transformer 328 connected to the production meter 318 is installed with a reversed polarity, the power monitor 308 could potentially report that the power source is consuming power when in fact the power source is generating power. If the current transformer 334 connected to one of the production meters 320 is installed with a reversed polarity, the power monitor 308 could potentially report that an electric load is generating power when in fact the load is consuming power.

The wiring inspector 310 can be configured for determining that a power meter is installed with a reversed polarity by comparing a production time series and a consumption time series to respective reference values. For example, in the case of a photovoltaic solar system, the wiring inspector 310 can compare daytime power measurements to nighttime power measurements. If the nighttime power measurements indicate that power is flowing from the building electric system to the utility, then the wiring inspector 310 can determine that one of the CTs 334 and 340 designated for measuring consumption is installed with a reversed polarity. If the system 106 is coupled to an electric system with more than one branch circuit, each with its own CT, the wiring inspector can check for wiring faults in each of the branch circuits.

Another type of error combination includes crossed wiring of CTs. For example, one wire from each CT 334 and 340 could be incorrectly connected to one of the terminals of the other's connector. The resulting signals produced by the CTs will still produce a signal that is recognized as a possibly-legitimate value. But the logical values of these CTs would not match that normally observed when connected correctly. The wiring inspector 310 can determine that that the CTs are cross-wired by comparing the reported values from the CTs.

Depending on the combination of CTs and their possibly crossed wiring, in some instances that crossed wiring will directly introduce a DC error-indicating offset signature similar to that of unconnected CTs. In other instances, the DC voltage levels may indicate the connection to the CTs is correct, but the AC signals presented from those CTs will not logically match to the normal measured-current and energy production. Also, during such incorrect crossed wiring, the nature of the AC signals from the CTs can produce an alternating fluctuation of the measured and compared DC offset that is not normal and less symmetrically-typical from that of a correctly connected installation. The computer system 610 can be configured to compare such illogical current and AC fluctuation measurements, and determine there is an incorrect coupling between each of the CT channels.

In some examples, the system 160 is coupled to a multi-phase electric system, and each of the consumption meters 320 and 322 is configured for measuring electric power consumed by a respective phase line of the multi-phase electric system. Then, the wiring inspector 310 can be configured for comparing consumption values from one power meter 320 to consumption values from the other power meter 322. The wiring inspector 310 can determine, based on the comparing, that a fault exists in the wiring of the multi-phase electric system.

For example, suppose that the multi-phase electric system is a split-phase electric system having two alternating current phase lines and a neutral line. Then, determining that a fault exists in the wiring of the multi-phase electric system can include determining first and second line-to-neutral voltages and determining that a difference between the magnitudes of the first and second line-to-neutral voltages exceeds a threshold difference.

Where the multi-phase electric system is a split-phase electric system, determining that a fault exists in the wiring of the multi-phase electric system can include determining that the two alternating current phase lines are not of opposite electrical phase. Determining that a fault exists in the wiring of the multi-phase electric system can include comparing measurements from the two alternating current phase lines to neutral, comparing measurement from the two alternating current phase lines to ground, and determining an indication of neutral-to-ground integrity based on the comparing.

In another example, suppose that the system 106 is coupled to one or more inverters for converting direct current power generated by the photovoltaic solar system to alternating current power. Then, determining that a fault exists in the wiring of the multi-phase electric system can include comparing voltage measurements from a photovoltaic solar system monitoring interface (e.g., power meter 318) to voltage measurements from an inverter monitoring interface and determining a measure of wiring integrity based on the comparing.

If the comparing reveals, e.g., a difference between the voltage measurements exceeding a threshold, then the wiring inspector can determine that a wiring fault may exist between the photovoltaic solar system and the inverters. For example, determining the measure of wiring integrity can include determining an indication of possible insufficient installation wire sizing.

In some examples, the wiring inspector 310 is configured for comparing power measurements from each inverter of a multi-inverter system (e.g., with microinverters each coupled to a respective photovoltaic string) to an aggregate measured power from a system-level metering interface. The wiring inspector 310 can be configured to enable, disable, or reduce power generation from at least one of the inverters based on the comparing.

In some examples, the wiring inspector 310 is configured for correcting detected wiring faults. The wiring inspector 310 can be configured for automatically correcting detected wiring faults, e.g., without user input and in response to detecting wiring faults. The wiring inspector 310 can also be configured for correcting detecting wiring faults after reporting the wiring faults and receiving commands to correct the wiring faults.

For example, the wiring inspector 310 can be configured to compensate for a power meter being installed with a reversed polarity by configuring the power monitor 308 to invert the sign of each measured value from the power meter. In some examples, the processing core 304 can invert the signs of the measured value. In some other examples, the system 106 includes input/output multiplexers configured for remapping measurement inputs.

Figure 4:
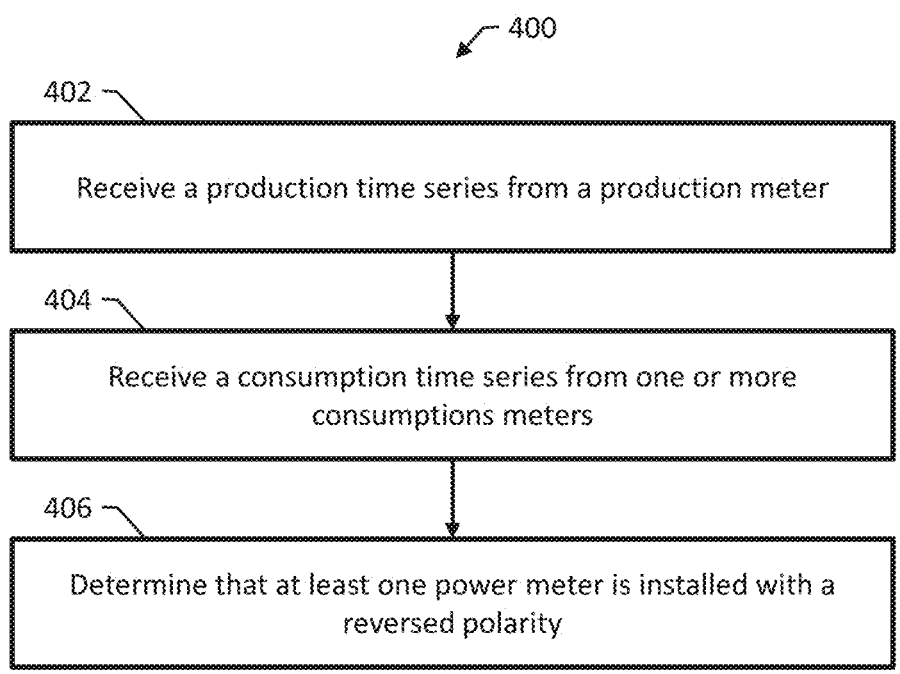
FIG. 4 is a flow diagram of an example method for determining that at least one power meter is installed with a reversed polarity that is reversed with respect to an installation specification.

FIG. 4 is a flow diagram of an example method 400 for determining that at least one power meter is installed with a reversed polarity that is reversed with respect to an installation specification. The method 400 can be performed by a computer system, e.g., the computer system 302 of FIG. 3.

The method 400 includes receiving a production time series of electric production values from a production power meter (402). The production power meter is coupled to a power generation system of a building and configured for measuring electric power generated by a power generation system.

The method 400 includes receiving a consumption time series of electric consumption values from one or more consumption power meters (404). The consumption power meters are coupled to an electric system of the building and configured for measuring electric power consumed by the electric system.

The method 400 includes determining, by comparing the production time series and the consumption time series to respective reference values, that at least one power meter is installed with a reversed polarity that is reversed with respect to an installation specification. As a result of that power meter being installed with a reversed polarity, the computer system receives measured values from that power meter having an incorrect sign.

For example, the power generation system can be an intermittent power source, e.g., using solar or wind power. Comparing the production time series to reference values can then include selecting at least one electric production value from the production time series during a time when the intermittent power source is specified as idle and determining that the at least one electric production value has a sign that indicates power production.

For example, suppose that the power generation system is a photovoltaic solar system, and that the electric system is configured to consume electric power from the photovoltaic solar system and a utility grid and to export electric power to the utility grid when the power generated by the photovoltaic solar system exceeds the power consumed by the electric system. The method 400 can include determining a net energy export time series for the electric system based on the production time series and the consumption time series. Then, determining that at least one of the production power meter and the consumption power meters is installed with an incorrect polarity can include selecting at least one net energy export value from the net energy export time series at a time during a night and determining that the net energy export value has a sign that indicates a positive net energy export at the time during the night. As a result of determining that the net energy export value has a sign that indicates a positive net energy export at the time during the night, the method 400 includes determining that one of the consumption power meters is installed with a reversed polarity.

In some examples, the method 400 includes displaying on a display an alert message indicating that the at least one power meter is installed with a reversed polarity. In some examples, the method 400 includes transmitting, on a data communications system and to a remote computer system, an alert message indicating that the at least one power meter is installed with a reversed polarity.

In some examples, the method 400 includes determining a net energy consumption time series for the electric system based on the production time series and the consumption time series. The, the method 400 can include displaying at least a portion of the net energy consumption time series on a display or transmitting the portion of the net energy consumption time series to a remote computer system or both. The method 400 can include compensating for the at least one power meter being installed with a reversed polarity by inverting, for each net energy consumption value in the portion of the net energy consumption time series, the sign of the corresponding measured values from the at least one power meter.

Figure 5:
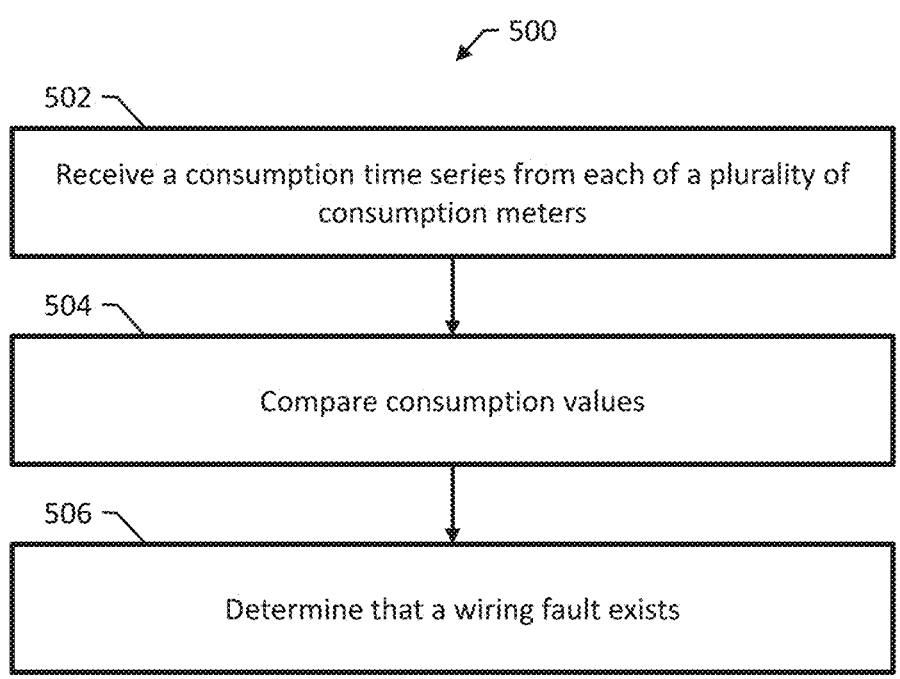
FIG. 5 is a flow diagram of an example method for determining that a fault exists in the wiring of a multi-phase electric system.

FIG. 5 is a flow diagram of an example method 500 for determining that a fault exists in the wiring of a multi-phase electric system. The method 500 can be performed by a computer system, e.g., the computer system 302 of FIG. 3. The computer system is coupled to a number of consumption power meters coupled to the multi-phase electric system, and each consumption power meter is configured for measuring electric power consumed by a respective phase line of the multi-phase electric system.

The method 500 includes receiving, from each consumption power meter, a consumption time series of electric consumption values (502). The method 500 includes comparing at least a first consumption value from a first consumption power meter to a second consumption value from a second consumption power meter (504). The method 500 includes determining, by comparing the first consumption value with the second consumption value, that a fault exists in the wiring of the multi-phase electric system (506).

For example, suppose that the multi-phase electric system is a split-phase electric system having two alternating current phase lines and a neutral line. Then, determining that a fault exists in the wiring of the multi-phase electric system can include determining first and second line-to-neutral voltages and determining that a difference between the magnitudes of the first and second line-to-neutral voltages exceeds a threshold difference.

Where the multi-phase electric system is a split-phase electric system, determining that a fault exists in the wiring of the multi-phase electric system can include determining that the two alternating current phase lines are not of opposite electrical phase. Determining that a fault exists in the wiring of the multi-phase electric system can include comparing measurements from the two alternating current phase lines to neutral, comparing measurement from the two alternating current phase lines to ground, and determining an indication of neutral-to-ground integrity based on the comparing.

In some examples, the computer system 302 is coupled to a photovoltaic solar system and one or more inverters for converting direct current power generated by the photovoltaic solar system to alternating current power for consumption by the multi-phase electric system, export to a utility grid, or both. Then, determining that a fault exists in the wiring of the multi-phase electric system can include comparing voltage measurements from a photovoltaic solar system monitoring interface to voltage measurements from an inverter monitoring interface and determining a measure of wiring integrity based on the comparing. For example, determining the measure of wiring integrity can include determining an indication of possible insufficient installation wire sizing.

Where the computer system 302 is coupled to a photovoltaic solar system and one or more inverters, the method 500 can include comparing power measurements from each inverter to an aggregate measured power from a system-level metering interface. The method 500 can include determining to enable, disable, or reduce power generation from at least one of the inverters based on the comparing.

In some examples, the multi-phase electric system is configured to consume electric power from the photovoltaic solar system and a utility grid and to export electric power to the utility grid when the power generated by the photovoltaic solar system exceeds the power consumed by the multi-phase electric system. Then, the method 400 can include determining a net energy consumption time series for the multi-phase electric system. The method 400 can include displaying at least a portion of the net energy consumption time series on a display or transmitting the portion of the net energy consumption time series to a remote computer system or both.

Figure 6:
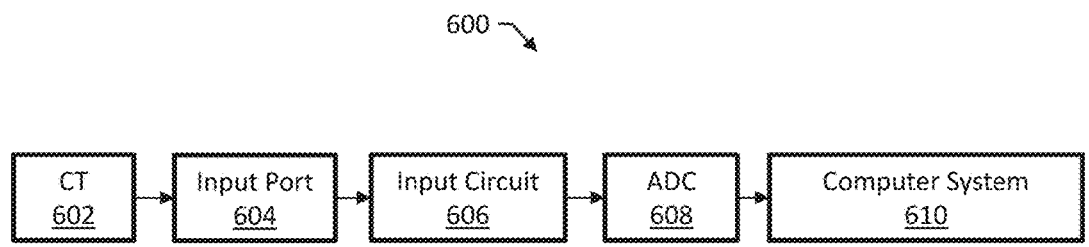
FIG. 6 is a block diagram of a system for determining whether or not a current measurement circuit is connected to a current measurement input port.

FIG. 6 is a block diagram of a system 600 for determining whether or not a current measurement circuit 602 is connected to a current measurement input port 604. The system 600 includes a current measurement input port 604, e.g., as part of a power meter such as one of the power meters 318, 320, 322 of FIG. 3. The system includes an input circuit 606 coupled to the current measurement input port 604. The system includes an analog-to-digital converter (ADC) 608 coupled to the input circuit 606 and a computer system 610 coupled to the ADC 608. The computer system can be, e.g., the computer system 302 of FIG. 3.

The input circuit 606 can be configured to perform low voltage, scaled analog signal buffering and amplification to ensure consistent and accurate signals are presented to the ADC 608. The input circuit 606 can be implemented by a balanced, differential-input configuration. In such a balanced signal-input configuration, termination resistors, including those also utilized as loading for signal matching for connected CTs, may be referenced to a static DC signal level that is roughly centered within the operating range of the ADCs. This static DC reference helps ensure optimum performance of the ADCs across the operating range of signals delivered by the CT's.

In some examples, these termination resistors are referenced to a common, mid-point voltage, and it is this mid-point voltage that contributes to the static DC operating signal level. However, if the termination resistance is evenly divided such that each half is referenced to separate high and low DC voltages, a DC imbalance and static DC offset is introduced into the ADC 608.

CTs typically have a very small DC impedance, and the termination resistors of the input circuit are typically high impedance. Therefore, if the CT 602, with its very low impedance is connected across the two DC-imbalanced inputs, the low impedance of the CT 602 effectively ties the two imbalanced inputs together to the originally-desired DC midpoint. When properly connected, there is no imbalance nor impairment to the optimum operating range of the analog signal output from the CT 602 to the ADC 608.

The net effect is that with no CT connected, the ADC 608 will see a static offset value. With the CT 602 connected, the offset is eliminated, allowing the ADC 608 to operate and measure its specified current measurement signal. Loading effects of the intentional offset impedances are incorporated into the design specifications that are matched to the loading for the CT 602, so that during normal, correctly wired operation, there is no degradation or measurement error. By monitoring for presence of a static DC offset at the ADC 608, a monitoring system can directly determine if a CT is connected across its termination connection simply by comparing that DC voltage level to its expected normal value.

The computer system 610 is programmed for receiving a measurement value from the ADC 608. If the measurement value indicates an offset voltage resulting from the DC reference voltage being divided over the termination resistors, the computer system 610 determines that the current measurement circuit 602 is not connected to the current measurement input port 604. If the measurement value does not indicate the offset voltage, i.e., by receiving a measurement value that deviates from the offset voltage, then computer system 610 determines that the current measurement circuit 602 is connected to the current measurement input port 604.

In some cases, the nature of a CT and its output AC signal can contribute to an alternating fluctuation of the measured and compared DC offset. For example, instead of a steady DC signal with or without an offset, the signal presented to the ADC may have an alternating value that contributes to the net DC offset. The computer system 610 can be configured for canceling out any alternating fluctuation of the measured DC offset used in determining correct CT connection, thereby still allowing proper detection of whether the CT is connected.

The computer system 610 can be programmed for causing an alert in response to detecting the current measurement circuit 602 is not connected to the current measurement input port 604. For example, the computer system 610 can display a message that the current measurement circuit 602 is not connected on a display, or transmit the message to a remote computer system, or both.

In some examples, a photovoltaic solar system installer can use the computer system 610 to verify that a monitoring system is properly connected. Since operation is inherently automatic by virtue of proper configuration of the termination resistors of the input circuit 606, if a failure occurs from disturbance to CT wiring connection after the installation is completed, the offset to the ADC is immediately present and available for diagnostic purposes, without need of special test functions or physical service calls to the site.

In some examples, the current measurement circuit is current transformer (CT) configured to produce a scaled analog electrical signal proportional to an alternating current flowing through a monitored wire. In some examples, the system 600 includes a photovoltaic solar system and a voltage measurement circuit, e.g., as shown in FIGS. 1-3, and the computer system 610 is configured for metering power production by the photovoltaic solar system using the voltage measurement circuit and the current measurement circuit.

Figure 7:
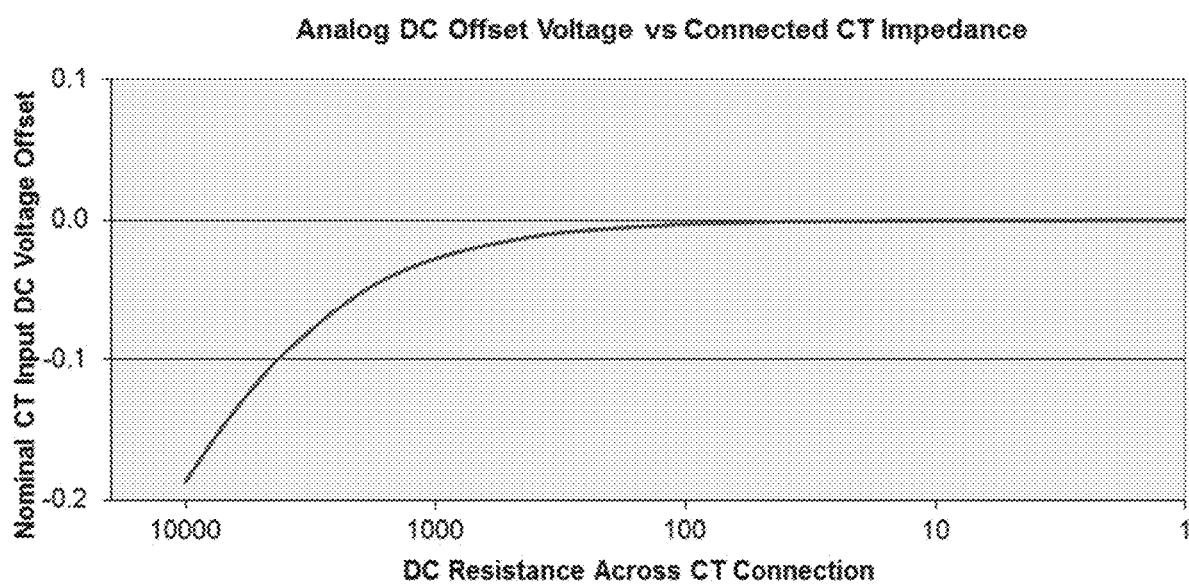
FIG. 7 is a graph illustrating the nominal CT input DC voltage offset for an example current measurement circuit.

FIG. 7 is a graph illustrating the nominal CT input DC voltage offset for an example current measurement circuit. The current measurement circuit is a CT, and when the CT is connected to the current measurement input port, the nominal CT input DC voltage offset varies insubstantially based on the DC resistance across the CT connection. The illustrated graph is only one example of several possible measurement conditions.

Referring back to FIG. 6, in general, the input circuit 606 includes a voltage supply circuit supplying a reference direct current (DC) voltage and termination resistors configured as loading for signal matching the current measurement circuit 602 at the current measurement input port 604. The ADC 608 has an operating range centered over the reference DC voltage, i.e., substantially centered over the reference DC voltage by operating as specified as long as the input voltage is within a threshold range of the reference DC voltage.

Figure 8A:
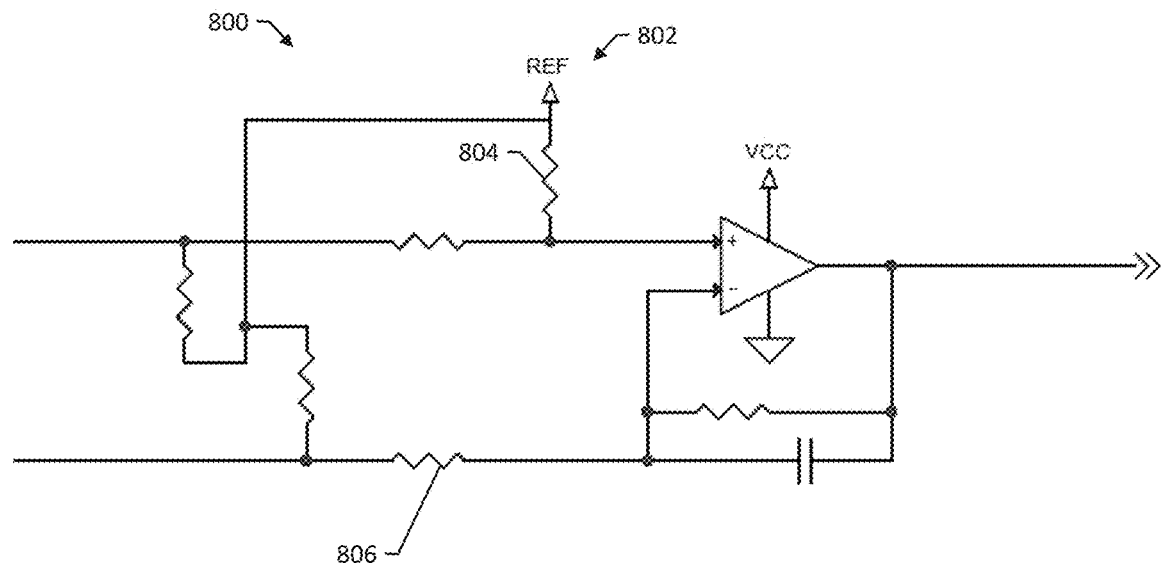
FIGS. 8A-8B illustrate two example input circuits for current measurement.
Figure 8B:
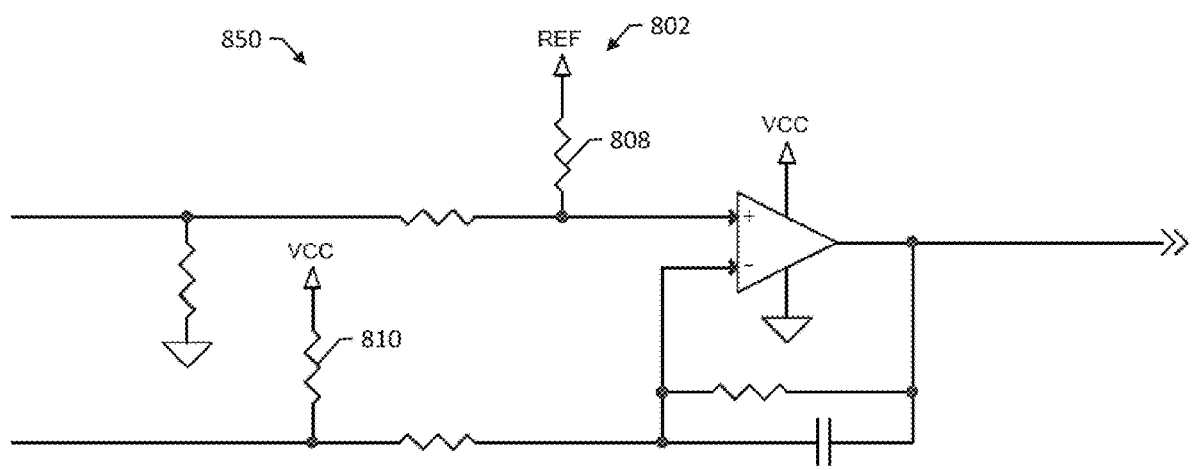

FIGS. 8A-8B illustrate two example input circuits for current measurement. FIG. 8A is a diagram of a first input circuit 800 including a reference DC voltage supply circuit 802 and balanced termination resistors 804 and 806. FIG. 8B is a diagram of a second input circuit 850 including the same DC voltage supply circuit 802. In contrast to the balanced resistors 804 and 806 of the first input circuit 800, the second input circuit 850 has high and low termination resistors 808 and 810.

Figure 9:
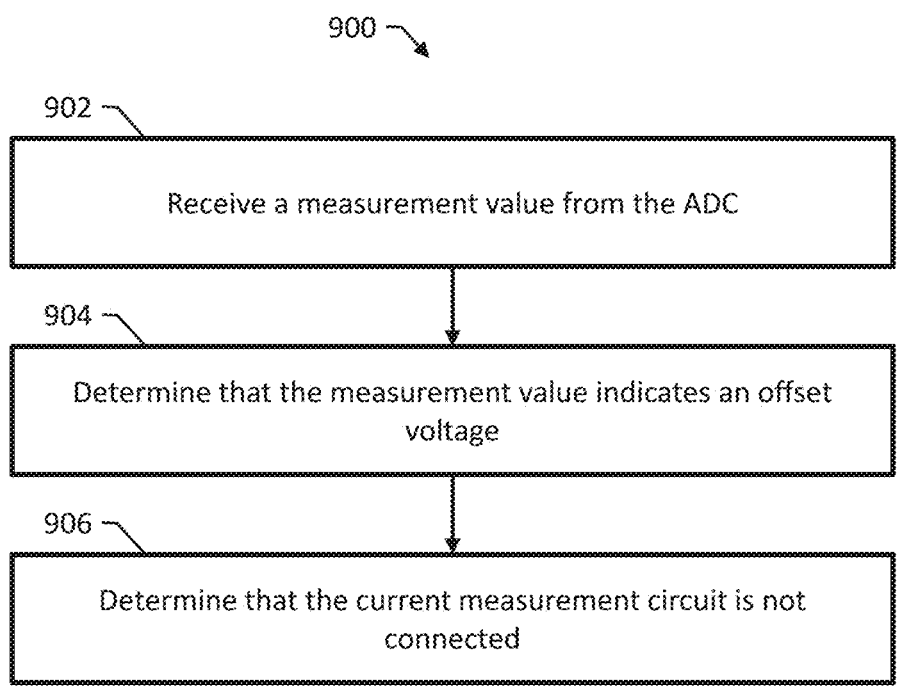
FIG. 9 is a flow diagram of an example method for determining whether or not a current measurement circuit is connected to a current measurement input port.

FIG. 9 is a flow diagram of an example method 900 for determining whether or not a current measurement circuit is connected to a current measurement input port. The method 900 can be performed by a computer system, e.g., the computer system 610 as illustrated in FIG. 6.

The method 900 includes receiving a measurement value from an ADC coupled to an input circuit, the input circuit being coupled to a current measurement input port, the input circuit comprising a voltage supply circuit supplying a reference DC voltage and high and low termination resistors configured as loading for signal matching a current measurement circuit at the current measurement input port, and the ADC having an operating range substantially centered over the reference DC voltage (902). The method 900 includes determining that the measurement value indicates an offset voltage resulting from the DC reference voltage being divided over the high and low termination resistors (904). The method 900 includes, as a result of determining that the measurement value indicates the offset voltage, determining that the current measurement circuit is not connected to the current measurement input port (906).

Although specific examples and features have been described above, these examples and features are not intended to limit the scope of the present disclosure, even where only a single example is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed in this specification (either explicitly or implicitly), or any generalization of features disclosed, whether or not such features or generalizations mitigate any or all of the problems described in this specification. Accordingly, new claims may be formulated during prosecution of this application (or an application claiming priority to this application) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A system comprising:
   a power generation system of a building comprising a photovoltaic solar system and a plurality of micro-inverters for converting direct current power generated by the photovoltaic solar system to alternating current power for consumption by an electric system of the building, export to a utility grid, or both;
   a production power meter coupled to the power generation system and configured for measuring electric power generated by the power generation system;
   one or more consumption power meters coupled to the electric system of the building and configured for measuring electric power consumed by the electric system; and
   a computer system coupled to the production power meter and the consumption power meters and programmed for:
      receiving a production time series of electric production values from the production power meter;
      receiving a consumption time series of electric consumption values from the consumption power meters;
      determining, by comparing the production time series and the consumption time series to respective reference values, that at least one power meter is installed with a reversed polarity that is reversed with respect to an installation specification, resulting in the computer system receiving measured values from the at least one power meter having an incorrect sign; and,
      comparing power measurements from each micro-inverter to an aggregate measured power from a system-level metering interface and determining to enable, disable, or reduce power generation from at least one of the micro-inverters based on the comparing.

2. The system of claim 1, wherein the power generation system comprises an intermittent power source, and wherein comparing the production time series to reference values comprises selecting at least one electric production value from the production time series during a time when the intermittent power source is specified as idle and determining that the at least one electric production value has a sign that indicates power production.

3. The system of claim 1, wherein the electric system is configured to consume electric power from the photovoltaic solar system and a utility grid and to export electric power to the utility grid when the power generated by the photovoltaic solar system exceeds the power consumed by the electric system.

4. The system of claim 3, wherein the computer system is programmed for determining a net energy export time series for the electric system based on the production time series and the consumption time series, and wherein determining that at least one of the production power meter and the consumption power meters is installed with an incorrect polarity comprises:
   selecting at least one net energy export value from the net energy export time series at a time during a night;
   determining that the net energy export value has a sign that indicates a positive net energy export at the time during the night; and
   as a result of determining that the net energy export value has a sign that indicates a positive net energy export at the time during the night, determining that one of the consumption power meters is installed with a reversed polarity.

5. The system of claim 1, comprising a display, and wherein the computer system is programmed for displaying on the display an alert message indicating that the at least one power meter is installed with a reversed polarity.

6. The system of claim 1, comprising a data communications system, and wherein the computer system is programmed for transmitting, on the data communications system and to a remote computer system, an alert message indicating that the at least one power meter is installed with a reversed polarity.

7. The system of claim 1, wherein the computer system is programmed for:
   determining a net energy consumption time series for the electric system based on the production time series and the consumption time series;
   displaying at least a portion of the net energy consumption time series on a display or transmitting the portion of the net energy consumption time series to a remote computer system or both; and
   compensating for the at least one power meter being installed with a reversed polarity by inverting, for each net energy consumption value in the portion of the net energy consumption time series, the sign of the corresponding measured values from the at least one power meter.

8. A system comprising:
a photovoltaic solar system and a plurality of inverters for converting direct current power generated by the photovoltaic solar system to alternating current power for consumption by a multi-phase electric system of a building, export to a utility grid, or both;
a plurality of consumption power meters coupled to the multi-phase electric system, each consumption power meter being configured for measuring electric power consumed by a respective phase line of the multi-phase electric system; and
a computer system coupled to the consumption power meters and programmed for:
receiving, from each consumption power meter, a consumption time series of electric consumption values;
comparing at least a first consumption value from a first consumption power meter to a second consumption value from a second consumption power meter;
determining, by comparing the first consumption value with the second consumption value, that a fault exists in the wiring of the multi-phase electric system; and,
comparing power measurements from each inverter to an aggregate measured power from a system-level metering interface and determining to enable, disable, or reduce power generation from at least one of the inverters based on the comparing.

9. The system of claim 8, wherein the multi-phase electric system is a split-phase electric system comprising two alternating current phase lines and a neutral line, and wherein determining that a fault exists in the wiring of the multi-phase electric system comprises determining first and second line-to-neutral voltages and determining that a difference between the magnitudes of the first and second line-to-neutral voltages exceeds a threshold difference.

10. The system of claim 8, wherein the multi-phase electric system is a split-phase electric system comprising two alternating current phase lines, and wherein determining that a fault exists in the wiring of the multi-phase electric system comprises determining that the two alternating current phase lines are not of opposite electrical phase.

11. The system of claim 8, wherein the multi-phase electric system is a split-phase electric system comprising two alternating current phase lines and a neutral line, and wherein determining that a fault exists in the wiring of the multi-phase electric system comprises comparing measurements from the two alternating current phase lines to neutral, comparing measurement from the two alternating current phase lines to ground, and determining an indication of neutral-to-ground integrity based on the comparing.

12. The system of claim 8, comprising a photovoltaic solar system and one or more inverters for converting direct current power generated by the photovoltaic solar system to alternating current power for consumption by the multi-phase electric system, export to a utility grid, or both, and wherein determining that a fault exists in the wiring of the multi-phase electric system comprises comparing voltage measurements from a photovoltaic solar system monitoring interface to voltage measurements from an inverter monitoring interface and determining a measure of wiring integrity based on the comparing.

13. The system of claim 12, wherein determining the measure of wiring integrity comprises determining an indication of possible insufficient installation wire sizing.

14. The system of claim 8, wherein the multi-phase electric system is configured to consume electric power from the photovoltaic solar system and a utility grid and to export electric power to the utility grid when the power generated by the photovoltaic solar system exceeds the power consumed by the multi-phase electric system, and wherein the computer system is programmed for:
determining a net energy consumption time series for the multi-phase electric system; and
displaying at least a portion of the net energy consumption time series on a display or transmitting the portion of the net energy consumption time series to a remote computer system or both.

15. A method performed by a computer system, the method comprising:
receiving a production time series of electric production values from a production power meter coupled to a power generation system of a building and configured for measuring electric power generated by the power generation system, the power generation system comprising a photovoltaic solar system and a plurality of inverters for converting direct current power generated by the photovoltaic solar system to alternating current power for consumption by an electric system of the building, export to a utility grid, or both;
receiving a consumption time series of electric consumption values from one or more consumption power meters coupled to the electric system of the building and configured for measuring electric power consumed by the electric system; and
determining, by comparing the production time series and the consumption time series to respective reference values, that at least one power meter is installed with a reversed polarity that is reversed with respect to an installation specification, resulting in the computer system receiving measured values from the at least one power meter having an incorrect sign;
comparing power measurements from each inverter to an aggregate measured power from a system-level metering interface; and
determining to enable, disable, or reduce power generation from at least one of the inverters based on the comparing.

16. The method of claim 15, wherein the electric system is configured to consume electric power from the photovoltaic solar system and a utility grid and to export electric power to the utility grid when the power generated by the photovoltaic solar system exceeds the power consumed by the electric system.

17. The method of claim 16, wherein the method comprises determining a net energy export time series for the electric system based on the production time series and the consumption time series, and wherein determining that at least one of the production power meter and one of the consumption power meters is installed with an incorrect polarity comprises:
selecting at least one net energy export value from the net energy export time series at a time during a night;
determining that the net energy export value has a sign that indicates a positive net energy export at the time during the night; and
as a result of determining that the net energy export value has a sign that indicates a positive net energy export at the time during the night, determining that one of the consumption power meters is installed with a reversed polarity.

18. The method of claim 15, comprising:
determining a net energy consumption time series for the electric system based on the production time series and the consumption time series;

displaying at least a portion of the net energy consumption time series on a display or transmitting the portion of the net energy consumption time series to a remote computer system or both; and compensating for the at least one power meter being installed with a reversed polarity by inverting, for each net energy consumption value in the portion of the net energy consumption time series, the sign of the corresponding measured values from the at least one power meter.

* * * * *